United States Patent [19]
Haq

[11] Patent Number: 5,728,346
[45] Date of Patent: Mar. 17, 1998

[54] FABRICATION OF CHIRAL COMPOSITE MATERIAL

[75] Inventor: Sajad Haq, Bristol, Great Britain

[73] Assignee: British Aerospace Public Limited Company, Hampshire, Great Britain

[21] Appl. No.: 698,390

[22] Filed: Aug. 15, 1996

[30] Foreign Application Priority Data

Aug. 16, 1995 [GB] United Kingdom ............ 9516792

[51] Int. Cl.⁶ ..................................... B29C 39/12
[52] U.S. Cl. .................. 264/437; 264/219; 264/254; 264/255; 264/263; 264/277; 264/427; 425/DIG. 33
[58] Field of Search ........................ 264/439, 480, 264/277, 250, 251, 254, 255, 263, DIG. 45, 219, 427, 437; 425/DIG. 33

[56] References Cited

U.S. PATENT DOCUMENTS 4,948,922  8/1990  Varadan et al. ............... 174/35 GC
5,061,172  10/1991  Fennessy, Sr. .
5,202,535  4/1993  Dauwen et al. ............... 174/35 R

FOREIGN PATENT DOCUMENTS 1 238 114  7/1971  United Kingdom .

Primary Examiner—Jan H. Silbaugh
Assistant Examiner—Edmund H. Lee
Attorney, Agent, or Firm—Cushman, Darby & Cushman IP Group of Pillsbury Madison & Sutro LLP

[57] ABSTRACT

Chiral composite material is made using an apertured plate (2) having apertures (3) therethrough corresponding to the desired locations of chiral elements (4) in the composite material. The plate (2) is located to overlie a substrate (1) with or without the intermission of spacer (10) which may be apertured in correspondence with the plate (2) or which may be ring like in form. The chiral elements (4) are held in position by locating means such as a tab (5) which may be magnetic in, on or associated with the plate (2) and a first layer (8) of liquid host material is placed in the apertures (3) around the elements (4) against the substrate (1), allowed to set and the plate (2) removed. A second layer (9) of liquid host material is then applied to the set first layer (8) and allowed to set to produce the desired composite material.

18 Claims, 2 Drawing Sheets

FABRICATION OF CHIRAL COMPOSITE MATERIAL

FIELD OF THE INVENTION

This invention relates to the fabrication of chiral composite material and particularly, but not exclusively, to a method for the fabrication of such material and to chiral composite material produced by this method.

BACKGROUND OF THE RELATED ART

Chiral, that is asymmetric, elements are useful for absorbing electromagnetic radiation, for example as radar absorbent material, particularly when embedded in or loaded into host materials such as a resin to form a composite material. However, attempts to manufacture such composite materials have encountered difficulties due to the small size of the chiral elements, usually helices, and the relatively large number of such chiral elements required.

For these reasons, fixing the locations of the chiral elements within the composite material is difficult, particularly as it is undesirable for the elements to be in contact with one another and is desirable for the elements to be distributed uniformly within the composite material. If the chiral elements are not uniformly distributed, the electromagnetic performance of the resulting composite material may be affected adversely. Additionally, the orientation of the chiral elements within the composite material has an influence on the electromagnetic properties of the material so that it may be necessary to fabricate a composite material with either randomly oriented elements or elements aligned in a specific direction.

OBJECTS OF THE INVENTION

Thus, one object of the present invention is to provide a generally improved method for the fabrication of chiral composite material which at least minimizes the foregoing difficulties.

This and other objects and advantages of the present invention will become more apparent from details disclosed in the following specification where preferred embodiments of the invention are described.

SUMMARY OF THE INVENTION

According to the present invention, there is provided a method for the fabrication of chiral composite material, characterized by the steps of preparing an apertured plate having apertures therethrough corresponding to the desired locations of chiral elements in the composite material to be prepared, locating the plate to overlie a substrate, placing the chiral elements in the apertures at the desired angle and orientation to the substrate and holding them in position by locating means in, on or associated with the apertured plate, placing a first layer of liquid host material in the apertures in the plate around the chiral elements and against the substrate and allowing the first layer to set, removing the apertured plate and applying a second layer of liquid host material to the set first layer and in turn allowing the second layer to set to produce the desired composite material.

Preferably, the aperture plate used is made from silicon.

Preferably, each locating means comprises a tab projecting into the relevant aperture in the plate. The tab is provided with a recessed surface to form a hook on which a projecting end or part of the associated chiral element is engaged. Preferably, the tab is dimensioned to project into a region of the associated chiral element which rests there against.

In the preferred embodiment, apertured plate utilized is magnetic, and the chiral elements used are magnetic such that the magnetic attraction between the apertured plate and chiral elements provides the locating means. The thickness of the apertured plate is chosen to provide the required thickness of the first layer around the chiral elements. Alternatively, the required thickness of the first layer is obtained by means of a spacer of desired thickness between the apertured plate and substrate. Preferably, the spacer used is a plate of the same or different material to that of the first layer, provided with apertures therethrough corresponding to the apertures in the apertured plate and in register therewith, the apertured spacer plate being incorporated in the set first layer.

Alternatively, the spacer used is in the form of a ring of any desired shape locatable between the apertured plate and substrate to extend in the vicinity of an outer edge of the apertured plate, forming an outer boundary for the first layer and removable therefrom when the first layer has set.

Preferably, the thickness of the apertured plate or of the spacer is chosen to provide the desired angle and orientation of the chiral elements in the composite material.

Ideally, the chiral elements used are helices, Mobius bands or irregular tetrahedra in shape and made from a metal or plastic.

Preferably, the substrate is planar or has a surface provided with depressions therein to complement the apertures in the overlying apertured plate and provide additional means for receiving and locating the chiral elements therein. The depth of the depressions in the substrate is chosen to assist in providing the desired angle of the chiral elements with respect to the substrate.

The first and/or second layer material used is preferably a resin or polystyrene.

The method should be carried out at least twice to provide a chiral composite material with a plurality of chiral element layers.

DESCRIPTION OF THE DRAWINGS

For a better understanding of the present invention, and to show how the same may be carried into effect, reference will now be made, by way of example, to the accompanying drawings, in which.

DESCRIPTION OF EMBODIMENTS OF THE INVENTION

A method according to the present invention for the fabrication of chiral composite material basically employs a substrate 1 which is preferably planar in form as shown in FIGS. 1 to 7 and conveniently made of silicon. Also used is an apertured plate 2 which has a plurality of apertures 3 therethrough corresponding to the desired locations of chiral elements 4 in the composite material to be prepared.

Figure 5:
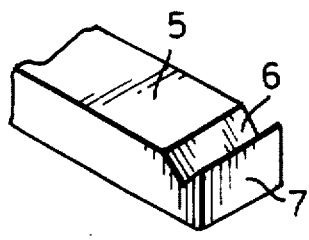
FIG. 5 is a perspective view to an enlarged scale of a tab for use in the method of the present invention.
Figure 6:
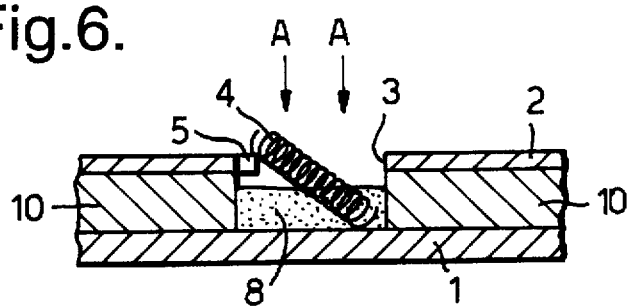
FIG. 6 is a diagrammatic cross sectional view of a substrate, spacer and apertured plate according to a second step in the method of the present invention.

The apertured plate 2, which can be made of any desired material such as metal or silicon, is located to overlie the substrate 1, and the chiral elements 4 are placed in the apertures 3 at the desired angle and orientation to the substrate 1 and held in position by locating means 5 in, on or associated with the apertured plate 2. The locating means 5 preferably is a tab, as shown in FIG. 5, projecting into the relevant aperture in the plate as shown in FIGS. 1 to 6 and 8 of the accompanying drawings. The tab 5 may be provided with a recessed surface 6 as shown in FIG. 5 of the accompanying drawings to form a hook 7 on which a projecting end or part of the associated chiral element is engaged as shown, for example, in FIGS. 1, 2, 3 and 4. Alternatively, the tab 5 is dimensioned to project into a region of the associated chiral element 4 which rests there against so that the tab projects into the element, which preferably is a helix as shown in FIG. 6.

As a further alternative, the apertured plate 2 utilized is magnetic, preferably made of metal, and the chiral elements 4 are magnetic so that the magnetic attraction between the aperture plate 2 and chiral elements 4 provides the locating means. Conveniently, this is still by way of a tab 5 projecting into the aperture 3 as shown, for example, in FIG. 8 of the accompanying drawings.

Following location of the chiral elements 4, a first layer 8 of liquid host material such as a resin or polystyrene is applied in the direction of the arrows A in FIG. 6 into the apertures 3 in the apertured plate 2 to at least partially surround the chiral elements 4. The liquid material of the first layer flows around the chiral elements 4 and against the substrate 8 and is allowed to set. Subsequently, the apertured plate 2 is removed and a second layer 9 of liquid host material, which again may be a resin or a polystyrene, is applied to the set first layer 8 as shown in FIG. 7 and in turn allowed to set to produce the desired composite material.

Figure 1:
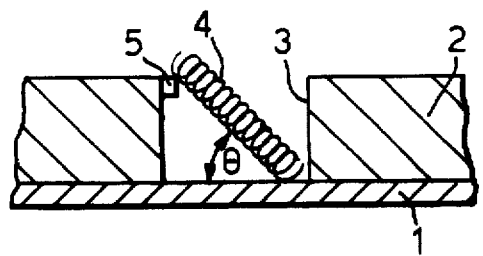
FIG. 1 is a diagrammatic sectional view through a substrate and apertured plate according to one step in the method of the present invention.

The angle θ, as shown in FIG. 1, between the chiral element 4, conveniently a helix, is determined primarily by the distance between the substrate 1 and the apertured plate 2 upper surface. This may be achieved by appropriately dimensioning the thickness of the apertured plate 2 as shown in FIG. 1, which may also control the thickness of the first layer 8 of host material around the element 4. Alternatively, the thickness of the first layer and angle of inclination θ of the chiral element 4 to the substrate 1 may be obtained by means of a spacer 10 of desired thickness between the apertured plate 2 and substrate 1.

Figure 2:
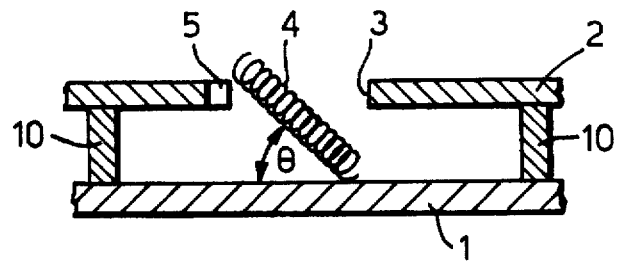
FIG. 2 is a diagrammatic sectional view of a substrate, apertured plate and spacer according to an alternative step in the method of the present invention.
Figure 3:
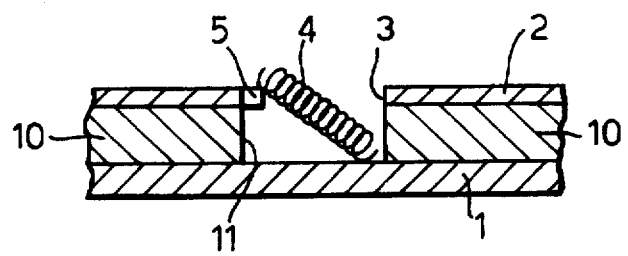
FIG. 3 is a diagrammatic cross sectional view of a substrate, spacer and apertured plate according to yet another alternative step in the method of the present invention.
Figure 4:
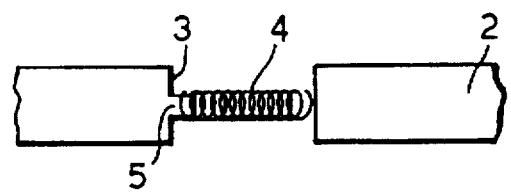
FIG. 4 is a plan view from above of FIG. 3.
Figure 7:
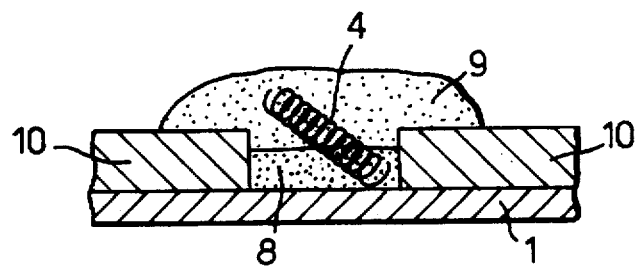
FIG. 7 is a cross sectional view of a substrate and spacer according to a third step in the method of the present invention.
Figure 8:
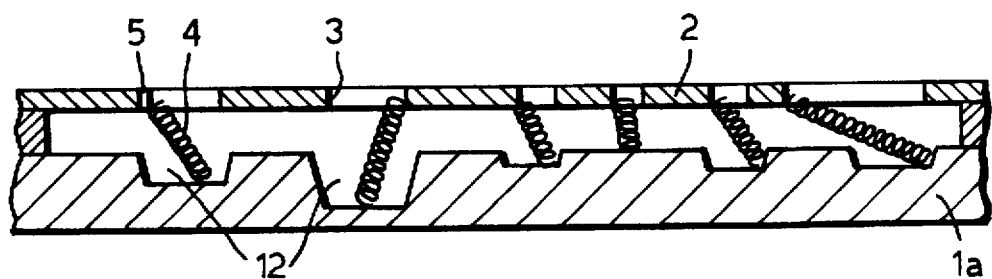
FIG. 8 is a diagrammatic cross sectional view through part of a modified way of implementing the method according to the present invention.

In the examples shown in FIGS. 2 and 8 of the accompanying drawings, the spacer 10 is in the form of a ring of any desired shape locatable between the apertured plate 2 and the substrate 1 to extend in the vicinity of an outer edge of the apertured plate 2, forming an outer boundary for the first layer 8 of host material which is removable therefrom when the first layer 8 has set. Alternatively, as shown in FIGS. 3, 6, and 7, the spacer 10 is a plate of the same or different material to that of the first layer 8 provided with apertures 11 therethrough corresponding to the apertures 3 in the apertured plate 2 and registered therewith.

The apertured spacer plate 10, as shown in FIG. 7, may be incorporated in the set first layer 8 of host material and in the set second layer 9 of host material. Thus, in the method the invention, the thickness of the apertured plate 2 alone or together with the thickness of the spacer 10 when used therewith is chosen to provide the desired angle of inclination and orientation of the chiral elements 4 with respect to the substrate 1 in the composite material. As aforesaid, these chiral elements 4 may be helices, Mobius bands or irregular tetrahedra in shape. They may be made of metallic material or of plastics material.

Although the first layer 8 and second layer 9 of host material have been shown as insertable via the apertures 3 and apertures 11, they may alternatively be inserted via holes provided laterally through the spacer 10. The method can be carried out at least twice to provide a chiral composite material with a plurality of chiral element layers or alternatively the single layer chiral element composite material may be produced according to the method of the invention and a plurality of these layers can be combined to produce either thicker or larger structures.

In order to obtain an isotropic chiral composite material or a material with a predetermined angular dispersion of chiral elements 4 the substrate 1a as shown in FIG. 8 may be provided with depressions 12 therein to complement the apertures 3 in the overlying apertured plate 2 and provide additional means for receiving and locating the chiral elements 4 therein. The depth of the depressions 12 is chosen to vary the angle of inclination θ of the chiral elements 4 to the base plate 1a.

Various modifications and alterations may be made to the embodiments of the present invention described and illustrated, within the scope of the present invention as defined in the following claims.

What is claimed:

1. A method for the fabrication of chiral composite material, comprising:

preparing an apertured plate having apertures therethrough corresponding to desired locations of chiral elements in the composite material to be prepared;

locating the apertured plate to overlie a substrate;

placing each of the chiral elements in the apertures at a desired angle and orientation to the substrate and holding them at said desired angle and orientation to the substrate;

placing a first layer of liquid host material in the apertures in the apertured plate around the chiral elements and against the substrate and allowing the first layer to set;

removing the apertured plate and applying a second layer of liquid host material to the first layer and allowing the second layer to set to produce the desired composite material.

2. A method according to claim 1, wherein the apertured plate is made from silicon.

3. A method according to claim 1, wherein the apertured plate contains a tab projecting into each aperture in the apertured plate.

4. A method according to claim 3, wherein the tab is provided with a recessed surface to provide a hook on which a projecting end or part of the associated chiral element is engaged.

5. A method according to claim 3, wherein the tab is dimensioned to project into a region of the associated chiral element such that the chiral element rests against the tab.

6. A method according to claim 1, wherein the apertured plate is magnetic, the chiral elements are magnetic and in which a magnetic attraction between the apertured plate and the chiral elements holds the chiral elements in position.

7. A method according to claim 1, in which the thickness of the apertured plate is chosen to provide a required thickness of the first layer around the chiral elements.

8. A method according to claim 1, wherein a required thickness of the first layer is obtained by means of a spacer of desired thickness between the apertured plate and the substrate.

9. A method according to claim 8, wherein the spacer is a plate of a same material as that of the first layer and the spacer is provided with apertures therethrough corresponding to the apertures in the apertured plate, said spacer plate being incorporated in said first layer.

10. A method according to claim 8, wherein the spacer is in a form of a ring locatable between the apertured plate and substrate to extend toward an outer edge of the aperture plate to form an outer boundary for the first layer, the spacer being removable therefrom when the first layer has set.

11. A method according to claim 1, wherein a thickness of the apertured plate or of the spacer is chosen to provide a desired angle and orientation of the chiral elements in the chiral composite material.

12. A method according to claim 1, wherein the chiral elements are selected from the group consisting of helices, Mobius bands or irregular tetrahedra in shape.

13. A method according to claim 12, wherein the chiral elements are made of metal or plastic.

14. A method according to claim 1, the substrate is planar or has a surface provided with depressions therein to complement the apertures in the apertured plate overlying the substrate and provide additional means for receiving and locating the chiral elements therein.

15. A method according to claim 14, wherein a depth of the depressions in the substrate is chosen to assist in providing a desired angle of the chiral elements with respect to the substrate.

16. A method according to claim 1, in which the material of at least one of the first and second layer is selected from the group consisting of resin and polystyrene.

17. A method according to claim 1, wherein said preparing of the apertured plate, said locating of the apertured plate, said placing of the chiral elements, said placing of the first layer, and said removal of the apertured plate is carried out at least twice to provide a chiral composite material with a plurality of chiral element layers.

18. A method according to claim 8, wherein the spacer is a plate of a different material as that of the first layer and the spacer is provided with apertures therethrough corresponding to the apertures in the apertured plate, said spacer plate being incorporated in said first layer.

* * * * *